(12) United States Patent
Helbling

(10) Patent No.: US 9,391,580 B2
(45) Date of Patent: Jul. 12, 2016

(54) AMBIENT AUDIO INJECTION

(71) Applicant: Cellco Partnership, Arlington, VA (US)

(72) Inventor: Chris L. Helbling, Norwalk, CT (US)

(73) Assignee: Cellco Paternership, Basking Ridge, NJ (US)

( * ) Notice: Subject to any disclaimer, the term of this patent is extended or adjusted under 35 U.S.C. 154(b) by 642 days.

(21) Appl. No.: 13/731,406

(22) Filed: Dec. 31, 2012

(65) Prior Publication Data
US 2014/0185828 A1    Jul. 3, 2014

(51) Int. Cl.
| H03B 29/00 | (2006.01) |
| G10K 11/16 | (2006.01) |
| A61F 11/06 | (2006.01) |
| H03G 5/16 | (2006.01) |
| H04R 1/10 | (2006.01) |
| H04R 25/00 | (2006.01) |
| H03G 3/32 | (2006.01) |
| H04R 5/04 | (2006.01) |
| H03G 3/24 | (2006.01) |
| G08B 13/14 | (2006.01) |

(52) U.S. Cl.
CPC ............ H03G 5/165 (2013.01); H04R 1/1041 (2013.01); G08B 13/1427 (2013.01); H03G 3/24 (2013.01); H03G 3/32 (2013.01); H04R 1/1083 (2013.01); H04R 5/04 (2013.01); H04R 25/407 (2013.01); H04R 25/505 (2013.01); H04R 2201/103 (2013.01); H04R 2201/107 (2013.01); H04R 2420/01 (2013.01); H04R 2430/01 (2013.01); H04R 2430/03 (2013.01); H04R 2460/01 (2013.01); H04R 2499/11 (2013.01)

(58) Field of Classification Search
CPC ........... H03G 5/165; H03G 5/16; H03G 3/32; H03G 3/20; H03G 3/24; H04R 1/1016; H04R 2410/05; H04R 5/02; H04R 1/10; H04R 1/1041; H04R 2420/07; H04R 5/033; H04R 2420/01; H04R 1/1083; H04R 5/027; H04R 2201/107; H04R 25/00; H04R 1/1091; H04R 5/04; H04R 2460/01; H04R 25/407; G10K 11/16; G10K 11/1788; G10K 2210/3051; H04M 1/6058; H04M 1/05; H04M 1/6066; H04B 15/00; G10H 1/0025; G10H 1/40; G10H 2210/076; G10H 2240/251; G10H 2240/325; H04H 60/58; A61F 11/08; G08G 1/0965
USPC ........... 381/103, 311, 309, 71.1, 71.7, 74, 57, 381/71.6, 72, 317, 313, 56, 58, 94.8, 94.1, 381/373, 122, 312, 150; 455/569, 557, 575, 455/550, 556; 379/430, 433, 428, 434, 79; 700/94; 340/539.26, 539.11, 539.24
See application file for complete search history.

(56) References Cited

U.S. PATENT DOCUMENTS 4,549,289 A * 10/1985 Schwartz et al. ............ 369/53.1
7,872,574 B2 * 1/2011 Betts et al. ............... 340/539.26
(Continued)

*Primary Examiner* — Vivian Chin
*Assistant Examiner* — Ubachukwu Odunukwe

(57) ABSTRACT

An exemplary system comprises a device including a memory with an audio injection application installed thereon. The application comprises an equalizer module that analyzes sound characteristics of individual digital audio samples including a discrete signal, a selector module that applies a selection heuristic to select the discrete signal from the individual digital audio samples based on the sound characteristics, and an audio module that supplies to an output an insert signal generated according to the discrete signal selected by the selection heuristic.

17 Claims, 3 Drawing Sheets

(56) References Cited

U.S. PATENT DOCUMENTS

| | | | |
|---|---|---|---|
| 2002/0150264 A1* | 10/2002 | Allegro | G10L 21/0208 381/94.1 |
| 2008/0153537 A1* | 6/2008 | Khawand | H03G 3/32 455/550.1 |
| 2011/0064241 A1* | 3/2011 | Kulkarni et al. | 381/94.2 |
| 2012/0071997 A1* | 3/2012 | Aliakseyeu | G08G 1/0965 700/94 |
| 2013/0182865 A1* | 7/2013 | Paul | 381/71.8 |
| 2014/0044269 A1* | 2/2014 | Anderson | H04R 5/04 381/57 |
| 2015/0171813 A1* | 6/2015 | Ganatra | H03G 3/24 381/57 |
| 2015/0222977 A1* | 8/2015 | Angel, Jr. | H04R 1/105 381/74 |
| 2015/0281829 A1* | 10/2015 | Gauger, Jr. | H04R 1/1083 381/71.6 |

* cited by examiner

AMBIENT AUDIO INJECTION

BACKGROUND

Noise canceling headphones, used in combination with an audio player, provide audio streams (e.g., music, phone calls, audio books, etc.) while reducing or eliminating ambient sounds (e.g., noise) by increasing a signal-to-noise ratio via active noise cancellation (ANC).

Yet, by their nature, noise canceling headphones also prevent warning sounds within the ambient sounds from reaching the user's ear. And, because at certain times an awareness of one's surroundings is a matter of safety, it may be prudent to identify and inject warning sounds into the audio streams despite the use of noise canceling headphones.

DETAILED DESCRIPTION

Figure 1:
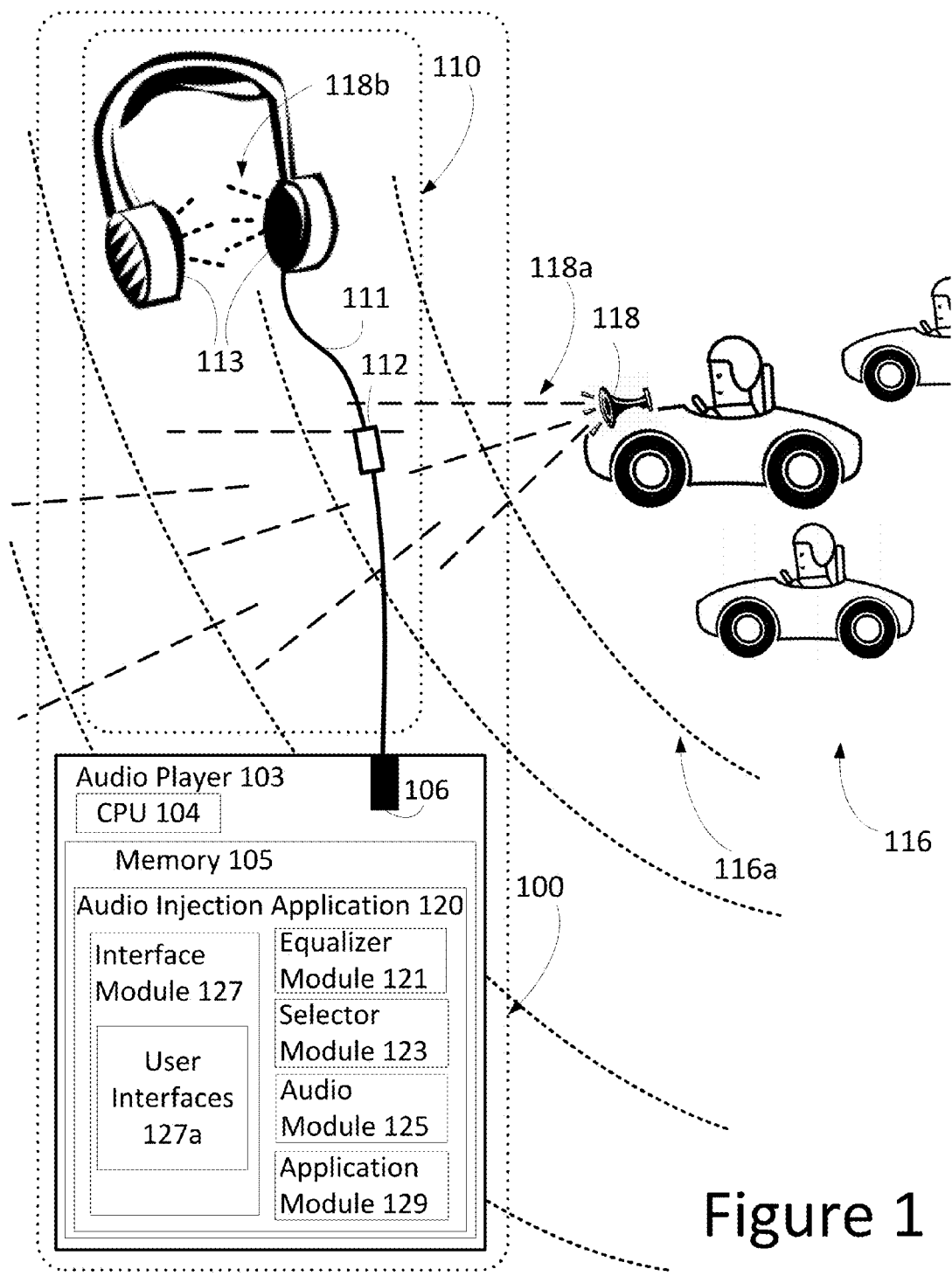
FIG. 1 illustrates an exemplary system in which ambient audio injection application operates.

An exemplary system and method may include headset comprising an audio injection application that equalizes ambient sounds external to the headset, which is processing an audio stream, selects discrete signals from the equalized ambient sounds, and injects the discrete signals into the audio stream.

A headset may be a computing device comprising an audio amplifier (e.g., a speaker) that transmits a sound wave based on an audio stream received from an audio player. The headset may generally include a pair of speakers (examples of which may include but are not limited to headphones, stereophones, earphones, and earbuds) that are held in place close to a user's ears, and an audio player that manages data for producing audio streams. Further, the headset may include a power source in support of powering the operations of the pair of speakers and audio player, as described below.

A speaker may include any electric-to-acoustic transducer or sensor that converts an audio stream (e.g., an audio sample or electrical signal) to a sound wave. Examples of speakers may include passive loudspeaker systems, powered loudspeaker systems, fully active loudspeaker systems, and combinations thereof.

An audio player may be a computing device (or software implementation thereof) integrated with or independent of the headset that manages data for producing audio streams. Examples of audio players may include any of the computing devices as further described below.

An audio stream may be any electrical signal generated by an audio player that, when processed by a headset, is converted to a sound wave (e.g., music, phone calls, audio books, etc.) by at least one speaker.

An ambient sound may be any sound wave that is external to a headset (e.g., sound waves that are not produced by headset speakers) and detected by a microphone.

A discrete sound may be an ambient sound that if heard would alter a person's situational awareness (e.g., warning sound included in the ambient sounds). That is, a discrete sound is a warning sound that would generally trigger a conscious response or reaction in a person. Examples of discrete sounds (e.g., warning sounds) may include but are not limited to vehicle horn sounds, public address announcements, alarm sounds, and emergency vehicle sounds.

A microphone may include any acoustic-to-electric transducer or sensor that converts ambient sounds including a discrete sound to electrical signals (e.g., a set of digital audio samples).

An audio injection application may generally be software stored by an audio player that, when executed by the audio player, identifies a discrete signal from the set of digital audio samples and inserts the discrete signal, as an insert signal, into the audio stream.

A discrete signal may a digital audio sample selected from the set of digital audio samples by the audio injection application. The discrete signal is electronically representative of the discrete sound detected and converted by the microphone.

Thus, the exemplary system and method may include a headset integrated with an audio player and contained within the same general housing, where the headset stores and executes the audio player and an audio injection application based on the detection and conversion of ambient sounds to digital audio samples by a microphone of the headset.

Further, the audio injection application equalizes the digital audio samples processed by the microphone of the headset, identifies discrete signals in the equalized digital audio samples, and injects the discrete signals as insert signals into the an audio stream being generated by the audio player and processed by the headset.

Alternatively, the exemplary system and method may include a headset that is generally independent from an audio player except for a connection (e.g., a wired or wireless connection) to the audio player, where the audio player stores and executes an audio injection application based on the detection and conversion of ambient sounds to digital audio samples by a microphone of either the headset or audio player.

Further, the audio injection application equalizes the digital audio samples processed by the microphone of either the headset or audio player, identifies discrete signals in the equalized digital audio samples, and injects the discrete signals as insert signals into the stream being processed by the headset.

In addition, the exemplary system and method that includes the independent headset may be a network-based system in which the independent headset receives a stream from an independent computing system. For example, independent computing system may store and execute an audio player and an audio injection application based on the detection and conversion of ambient sounds to digital audio samples by a microphone, which may be external or internal to the headset.

FIG. 1 illustrates an exemplary system 100 (e.g., including a headset 110 that is generally independent from an audio player 103 except for a connection) in which an audio injection application 120 equalizes the digital audio samples produced by the microphone 112 and identifies discrete signals for injection into an audio stream processed by the headset 110.

In general, the audio injection application 120 utilizes an equalizer module 121 to process digital audio samples received from the microphone 112 by executing heuristics that generate a set of complex numbers. The audio injection application 120 next utilizes a selector module 123 to identify a complex number representative of a discrete signal from the set of complex numbers by executing selection heuristics. Then, the audio injection application 120 utilizes an audio module 125 to inject an insert signal based on the identified complex number into an audio stream that, when processed by the headset 110, is converted by the speakers 113 into sound waves.

Thus, as illustrated in FIG. 1, the exemplary system 100 comprises an audio player 103, which includes the audio injection application 120, connected via a port 106 to the headset 110 that includes a wire 111, a microphone 112, and speakers 113, which convert an audio stream to sound waves. External to the headset 110 and the audio player 103 is ambient sound 116a generated by a surrounding environment 116 that includes a discrete sound 118a generated by an object 118. Once the ambient sound 116a, including the discrete sound 118a, is detected by the audio injection application 120, the audio injection application 120 supplies an insert signal, which may be traced back to the discrete sound 118a, via the wire 111 to the speakers 133 to produce a reproduced sound 118b.

In particular, in FIG. 1, an example scenario is illustrated where noise cancellation headphones (e.g., headset 110) are employed to eliminate the noise (e.g., ambient sound 116a) generated by automobile traffic (e.g., environment 116). The headset is combined with an audio player to implement an audio injection process (e.g., via the audio injection application 120) that identifies a warning sound (e.g., discrete sound 118a) generated by a car horn (e.g., object 118), which is duplicated by the headphones (e.g., the speakers 113 of headset 110 output the reproduced sound 118b). Therefore, while the nature of the noise canceling headphones has eliminated or reduced the noise generated by the automobile traffic, the audio injection process has detected, identified, and reproduced a car horn in the automobile traffic through the headphones to enhance the headphone wearer's situational awareness (e.g., provide a warning for an approaching vehicle).

Exemplary system 100 may be referred to as a computing system that may take many different forms and include multiple and/or alternate components and facilities. While exemplary system 100 is shown in FIG. 1, the exemplary components illustrated in FIG. 1 are not intended to be limiting. Indeed, additional or alternative components and/or implementations may be used.

An audio player 103 may be referred to as a computing device that in turn includes hardware and software in support of the audio injection application 120. In particular, the audio player 103 includes the central processing unit (CPU) 104 and a memory 105 (e.g., non-transitory computer readable medium), where the CPU 104 executes instructions that may be constructed from program code stored on the memory 105. Further, the instructions stored on the memory 105 include the audio injection application 120.

More particularly, the audio player 103 may be referred to as a user device that in turn may include the audio injection application 120 that, stores and processes data in support of heuristics (which are further described below). The audio player 103 may include an electronic display (whether visual or interactive), a key pad by which a user may communicate with the audio injection application 120, and a port 106 for connecting to a wire 111 of the headset 110.

The computing systems and/or devices described herein, such as system 100, audio player 103, and headset 110, may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance. Examples of computing devices include, without limitation, a computer workstation, a server, a desktop, a notebook, a laptop, or handheld computer, or some other computing system and/or device, such as tablet computers or mobile phones.

A computing device may generally include computer-executable instructions, where the instructions may be executable by one or more computing devices such as those listed above. Computer-executable instructions may include, without limitation, executable files, operation codes, data structures, or any structure that may cause a computing device to perform tasks and any combination thereof. Computer-executable instructions may be compiled or interpreted from computer programs created using a variety of programming languages and/or technologies, including, without limitation, and either alone or in combination, Java™, C, C++, Visual Basic, Java Script, Perl, etc.

A CPU 104, in general, is a processor (e.g., a microprocessor) that receives instructions, e.g., from a memory, a computer-readable medium, etc., and executes these instructions, thereby performing one or more processes, including one or more of the processes described herein. Such instructions and other data may be stored and transmitted using a variety of computer-readable media. The CPU 104 may also include processes comprised from any hardware, software, or combination of hardware or software that carries out instructions of a computer programs by performing logical and arithmetical calculations, such as adding or subtracting two or more numbers, comparing numbers, or jumping to a different part of the instructions. For example, the CPU may be any one of, but not limited to single, dual, triple, or quad core processors (on one single chip), graphics processing units, visual processing units, and virtual processors.

A memory 105, in general, may be any computer-readable medium (also referred to as a processor-readable medium) that may include any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

A port 106 may include any connector used for digital or analog signal transfers. For instance, the port 106 may include electrical three contacts, although sometimes may include one, two, four, or more contacts, and be referred to as an audio jack, a phone jack, a phone plug, a jack plug, stereo plug, mini-jack, mini-stereo, headphone jack, tiny telephone connector, bantam plug, TS connector, and TRS connector. Alternatively, the port 106 may be any antenna technology that implements a wireless exchange of data, such as cellular, Bluetooth®, or the like, by converting propagating electromagnetic waves to and from conducted electrical signals.

A headset 110 may be a device comprising any audio amplifiers that transmit sound waves based on electrical signals received from an audio player 103. In particular, the headset 110 is a device that includes a wire 111, a microphone 112, and speakers 113. The headset 110 may be a computing device that contains a processor and memory to provide the functionality described in this application. Alternately, this functionality may reside partially or wholly within a computing device to which the headset 110 is connected, whether the connection is wired, wireless, or a combination of both.

The headset 110 may be wired to the audio player 103 as shown in FIG. 1 (e.g., via wire 111 and port 106), wirelessly connected to the audio player (e.g., via cellular or Bluetooth® technology), or integrated with the audio player 103, such that the hardware and software of both computing devices are contained within the same general housing.

The headset 110, for example, may be noise-cancelling headphones that reduce or eliminate unwanted acoustic noise (e.g., ambient sound 116a) external to the headset 110 by active noise control (ANC). ANC is a process of detecting an original sound wave and emitting a canceling sound wave (e.g., an "anti-noise" signal) with the same amplitude but with inverted phase to the original sound so that the canceling sound wave combines with the original sound wave to form a new wave that effectively has a minimal amplitude (e.g., the waves effectively cancel each other out to produce a reduced sound).

A wire 111 may be any headphone, stereo, or speaker wire that makes the electrical connection between the port 106 and headset 110. For example, the wire 111 may include one, two, or more electrical conductors individually insulated by plastic so that electrical signals are transferred between the port 106 and headset 110. Further, the wire 111 may include the microphone 112 for detecting ambient audio sounds. Alternatively, the wire 111 may also be any wireless connection technology that implements a wireless exchange of data, such as cellular, Bluetooth®, or the like.

A microphone 112 may include any acoustic-to-electric transducer or sensor that converts sound waves into electrical signals (e.g., set of digital audio samples). Further, the microphone 112 may be included as part of the wire 111 or may be integrating into the audio player 103, the headset 110, or both.

The speakers 113 may include any electric-to-acoustic transducer that converts electrical signals to sound waves.

An environment 116 may be an aggregation of things surrounding the headset 110 and audio player 103 that in combination produce an ambient sound 116a. Examples of environments include but are not limited to an airplane cabin, a street filled with automobile traffic, a coffee shop, an airport, a seaport, a train station, a mall, a building or office lobby, a grocery store, and a house. In the case of FIG. 1, the environment 116 is illustrated as a street filled with automobile traffic.

An ambient sound 116a may be a single or collection of sound waves produce by an environment. Examples of ambient sounds 116a includes but are not limited to cabin noise, automobile traffic sounds, coffee shop chatter, a baby crying, a person snoring, and the sounds of general human activity in public (e.g., rolling suitcase, maintenance staff, ambient music, etc.). In the case of FIG. 1, the ambient sound 116a is illustrated as sounds generated from general automobile traffic.

An object 118 may be any person or thing that is part of the environment 116 and produces a discrete sound 118a. Examples of object 116 includes but are not limited to public address speakers, a car horn, safety alarm, an adult human, and the like. In the case of FIG. 1, the object 118 is illustrated as car horn that generates a discrete sound 118a.

A discrete sound 118a may be a particular ambient sound 116a, such as any announcement, instruction, or warning sound, produced by an object 118. Examples of discrete sounds 118a include but are not limited to sounds produced by public address speakers, a car horn, safety alarm, an adult human, and the like.

A reproduced sound 118b may be a reproduction by speakers 113 of a discrete sound 118a detected by a microphone 111 and processed by an audio injection application 120.

An audio injection application 120 is generally constructed from program code stored on the non-transitory computer readable medium. The audio injection application 120 may also be constructed from hardware, software, or a combination of hardware or software.

Further, in general, the audio injection application 120 may include an equalizer module 121, a selector module 123, an audio module 125, an interface module 127, and an application module 129. That is, in FIG. 1, the audio injection application 120, and the modules are provided as software stored on a memory 105 that when executed by a CPU 104 provides the operations of an audio injection process described herein. Alternatively the audio injection application 120 and modules may be provided as hardware or firmware, or combinations of software, hardware and/or firmware.

In general, to provide an audio injection process, an equalizer module 121 may utilize heuristics (e.g., Fast Fourier Transform (FFT) heuristics) to transform digital audio samples representative of the ambient sounds 116a, including discrete sound 118a, detected by the microphone 112 into a set of complex numbers. A selector module 123 then identifies complex numbers representative of discrete signals based on a selection heuristic for user notification and generates an insert signal based on the identified complex numbers. An audio module 125 then injects the insert signal into or supplies the insert signal as the audio stream being sent via a wire 111 to speakers 113, such that the speakers 113 may output a reproduced sound 118b.

An equalizer module 121 may include program code for detecting sound characteristics of individual digital audio samples representative of individual ambient sounds 116a. Sound characteristics for any particular ambient sound 116a may include but is not limited to pitch, timbre, and loudness. Pitch may be referred to as the frequency of the sound (e.g., low pitch may be a bass sound such as a thunder sound, high pitch may be a treble sound such as an infant's voice, and midrange pitch may be a sound between low and high pitch such as a car horn or an adult voice). Timbre may be referred to as tone color or quality of a sound or tone that distinguishes different types of sound production. The loudness may be referred to as the intensity of the sound stimulus (e.g., a dynamite explosion is loader than that of a cap pistol because of the greater amount of air molecules the dynamite is capable of displacing).

Thus, the equalizer module 121 may utilize or control at least one microphone (e.g., the microphone 112) to detect and convert ambient sounds 116a to digital audio samples and may utilize a heuristic to transform the digital audio samples into individual components representative of sound characteristics. Further, the equalizer module may utilize any number of microphones or microphone configurations, such as a microphone integrated with the audio player or a microphone external to the headset, provided the electrical signals generated by the any number of microphones or microphone configurations are received by the equalizer module 121.

More particularly, in one exemplary approach the equalizer module 121 utilizes Fast Fourier Transform (FFT) heuristics to process the digital audio samples into individual components representative of sound characteristics (e.g., complex numbers). In other words, the FFT heuristics may transform digital audio samples converted by a microphone configuration from detected sound waves (e.g., ambient sounds 116a including a discrete sound 118a) into information that identifies such components as the pitch, timbre, loudness, and duration of the detected sound waves.

The individual components representative of sound characteristics may be array of complex numbers that represent a magnitude (e.g., real part) and a phase (e.g., imaginary part) of the frequencies present in the digital audio samples. The array of complex numbers may also include a time component indicating the duration of the detected sound waves that may be utilized for processing false positives. Further, the equalizer module 121 may also include program code to emulate any of a parametric, semi-parametric, graphic, peak, and program equalizers.

A selector module 123 may include program code for selecting, e.g., eliminating or injecting, ambient sounds 116a based on the timbre. For example, the selector module 123 may utilize a selection heuristic to identify which of the complex numbers produced by the equalizer module 125 should be provided to the speakers 113 as an insert signal. A selection heuristic may be any logic or technique for selecting a complex number representative of a discrete signal, including but are not limited to low/high band, Boolean, self-learning, and variable selection heuristics. Further, the selection heuristic may be set by an initial default configuration or may be altered, updated, or changed based on an input received from the interface module 127, as further described below.

For example, a low/high band selection heuristics may include implementing a frequency band filter that selects complex numbers relative to a frequency band lower than a set value. Thus, for example, because an infant's sound characteristics are higher than an adult human's sound characteristics, a frequency band filter may select complex numbers representative of an adult speaking because the complex numbers are lower than the set value while the frequency band filter may ignore complex numbers representative of an infant crying because the complex numbers are higher than the set value.

Also for example, a Boolean selection heuristic may include applying "if-then" logic to each complex number produced by the equalizer module 125 in real time. For instance, audio injection application 120 may store a frequency table that states the "if-then" logic, where a first column lists predetermined complex numbers representative of a range of sound characteristics and a second column lists a Boolean value indicating whether the relative predetermined complex numbers should be selected (e.g., are representative of discrete signals).

Thus, when the Boolean selection heuristic receives a complex number, that complex number is matched to the table and identified by the Boolean value. If the Boolean value is "PASS," then that complex number is representative of a discrete signal. If the Boolean value is "FAIL," then that complex number may be ignored as it likely represents an ambient sound 116a that is not a discrete sound 118a.

Further, independent of or along with the selection heuristics mentioned above, the selector module 123 may include a false positive selection heuristic that analyzes the time component of the complex numbers. For example, the time component may be used by the selector module 123 to filter complex numbers relative to a duration threshold. For instance, when a duration threshold is set at one second and when the false positive selection heuristic is set to ignore complex numbers with a time component that is less than one second, only complex numbers representative of discrete signals with a time component of one second or greater may be selected by the selector module 123.

Regardless of which selection heuristic is utilized, the selector module 123 generates an insert signal from the identified or selected complex number and supplies that insert signal to an audio module 125 for processing.

An audio module 125 may include program code for playing back audio streams. Audio streams may electrical signals that provide, for example, music, phone calls, audio books, etc., to the speakers 113 of the headset 110. The audio module 125 may also include program code for receiving an insert signal from the selector module 123 and supplying the insert signal with or as an audio stream to the headset 110.

Further, the audio module 125 may include program code for configuring the methods of supplying the insert signal and volume levels at which the insert signal is supplied (e.g., operation configurations). For instance, a default operation configuration provides an insert signal supply method that mixes the insert signal received from the selector module 123 into a supplied audio stream at a pre-defined level. For example, when the audio module 125 receives an insert signal from the selection module while supplying an audio stream to the headset 110, one method for supplying the insert signal to the headset 110 may be for the audio module 125 to mix the insert signal with the supplied audio stream, such that a reproduced sound 118b is produced by the speakers 113 along with currently playing, for example, music, phone calls, audio books, etc., at the pre-defined level (e.g., 25%, 50%, or 75% of a currently set volume level). Alternatively, another method is for the audio module 125 to stop supplying the audio stream in favor of only supplying the insert signal to the headset.

The audio module 124 may have stored a set of predetermined themes, which are predetermined based on a default configuration or selected via an input (e.g., a user input), that govern the methods and volume levels. Thus, based on selected predetermined theme, a set of default configurations for the signal supply method and volume levels is automatically implemented by the audio module 124. Further, each predetermined theme may relate to a specific environment. For example, the audio injection application 120 may be utilized during a number of scenarios (e.g., cycling, flying, studying, etc.) specific configurations that are optimal for each scenario.

For example, in cycling scenarios, the predetermined theme of cycling may be selected and the corresponding operation configurations optimal for cycling scenarios may be implemented by the audio injection application 120. For instance, the insert signal may be supplied to the headset 110 instead of the supplied audio stream at a 100% volume level, the equalizing and selecting heuristics may be configured to select specific frequencies that match recordings of horn sounds, and geographic and temporal settings may be configured to disable the audio injection application when the system 100 is not moving at a predefined speed (e.g., greater than 5 miles per hour) for a predefined duration of time (e.g., a time greater than 4 minutes).

For example, in flying scenarios, the predetermined theme of flying may be selected and the corresponding operation configurations optimal for flying scenarios may be implemented by the audio injection application 120. For instance, the insert signal may be supplied to the headset 110 along with the supplied audio stream at a 50% volume level of a currently set volume level, the equalizing and selecting heuristics may be configured to muting ambient sounds that are not within an 'X' frequency range, and geographic and temporal settings may be disabled.

For example, in studying scenarios, the predetermined theme of studying may be selected and the corresponding operation configurations optimal for studying scenarios may be implemented by the audio injection application 120. For instance, the insert signal, such as a tone, may be supplied to the headset 110 instead of the supplied audio stream at a 50% volume level, the equalizing and selecting heuristics may be configured to muting all ambient sounds unless a particular frequency matching the sound of an alarm bell is detected.

Thus, the audio module 125 may permit custom configurations that based on a user input individually vary the methods and volume levels for the ambient audio injection. Examples of custom configurations may include mixing in the insert signal at a definable level (e.g., 0-100% of an original or currently set volume level), configuring a definable equalizer (e.g., selecting specific frequencies for inserting, where specific frequencies may be based on a pre-record or modeled audio), setting a particular frequency range (e.g., muting ambient sound unless ambient sounds is in an 'X' range over y threshold), installing custom predetermined themes (e.g., creating non-default environment profiles), configuring geographic and temporal setting that control the when and where of audio injection application 120 operation (e.g., setting specific combination of time of day, day of week, and location or the detection of movement and duration of movement), configuring alternatives to reproducing a detected discrete sound (e.g., the selector module 123 selecting, based on the type of sound and/or volume threshold, a tone or alert to be produced by the audio module 125 in favor of the reproduced sound 118b or other notifications, such as a voice recording of the word "WARNING" or the like), and configuring activation settings that include triggering or deactivating the audio injection application 120 based on a user input, detection of a power supply amount in view of a threshold, and the geographic and temporal settings as described above. In addition, the custom configurations may further operate in connection with internal mechanisms (e.g., a clock or timer installed within the headset 110) or in cooperation with external devices (e.g., the audio player 103) that are connected to the headset 110 to perform ambient audio injection.

An interface module 127 generates and manages user interfaces 127a that control and manipulate the audio injection application 120 based on a received user input (e.g., configure equalizer heuristics, configure selection heuristics, select predetermined themes, configure update settings, and customize configurations for supplying the insert signal), and an application module 129 facilitates communication between the modules of audio injection application 120 and hardware/software components external to the audio injection application 120.

The interface module 127 may include program code for generating, presenting, and providing one or more user interfaces 127a (e.g., in a menu, icon, tabular, map, or grid format) in connection with other modules for providing information (e.g., notifications, instructions, etc.) and receiving user inputs (e.g., configuration selections and adjustments, such as user inputs altering, updating, or changing the equalization or selection heuristics). For instance, interface module 127 may display user interfaces 127a for user management of the heuristic applied by the equalizer module 121, the selection heuristic applied by the selector module 123, or custom configurations governing the audio injection application 120. For example, a user interface 127a generated by the user interface module 127 may include a first table with selectable rows, where each row is connected to a sub table listing such that when a row is selected the corresponding sub-table is generated and displayed by the interface module 127.

That is, for example, a first table may have three rows. The first row may be identified by the title "Equalization" and may be linked to a sub-table of heuristics that may be applied by the equalizer module 121. The second row may be identified by the title "Selection" and may be linked to a sub-table of selection heuristics that may be applied by the selector module 123. The third row may be identified by the title "Customization" and may be linked to a sub-table of custom configurations governing the audio injection application 120. Upon selection of any row of the first table, the user interface 127a as generated by the user interface module 127 may then present the corresponding sub table.

The interface module 127 may also include program code for prompting pop-up interfaces and notifications, for providing and/or receiving additional information (e.g., presenting notifications, providing instructions, receiving a user input such as the selection of a predetermined theme, etc.) along with the user interfaces 127a.

A notification may include banners, badges, alerts, sounds, text, or any combinations thereof that signals an event (e.g., detection of a discrete sound 118a). A banner may be a drop-down menu that extends from a top portion of an electronic display and that may include text, badges, and animated symbols. A badge may be a number or symbol associated with a messaging service or an account. An alert may be a pop-up interface or window that is centered on the electronic display and that may include text, badges, and animated symbols.

For example, the pop-up interface may provide instructions along with buttons or icons that permit the receipt of a response (e.g., a user input) to the provided instructions. An icon may be a pictogram, small picture, symbol, or the like serving as a quick and intuitive representation of a software tool displayed on the electronic display.

Moreover, all user interfaces 127a described herein are preferably provided as software that when executed by the CPU provides the operations described herein. Alternatively the user interfaces 127a may be provided as hardware or firmware, or combinations of software, hardware and/or firmware.

In addition, the interface module 127 may be triggered/deactivated. For example, the interface module 127 may be triggered/deactivated manually or automatically and the interface module 127 may provide activation/deactivation features within the user interfaces for the operation configurations. Examples of triggers and deactivators may include but are not limited to turning on or off the audio injection application 120 or portions of the operation configurations based on a user's interaction with a user interface, based on the battery power relative to a predetermined threshold (e.g., if a current battery level exceeds a predetermined power level then the audio injection application 120 remains active), based on geographic and temporal settings (e.g., the audio injection application 120 remains active providing the headset is within a geographic location), based on the detection of movement (e.g., the audio injection application 120 remains active providing the headset is moving at a speed of 1 miles per hour or greater), etc. The triggers and deactivators may be provided internally within the integrated headset or when the headset is connected to a smart phone or other device (e.g., network-based computing system).

The application module 129 may include program code configured for the audio injection application 120 to communicate directly with other applications, modules, models, devices, and other sources through both physical and virtual interfaces. That is, the application module 129 may include program code and specifications for routines, data structures, object classes, and variables that package and present data entered by a user through the user interface 127a generated by the interface module 127 for transfer over a network.

Although the above example of the audio injection application 120 may include certain specific modules, the same or similar operability may be achieved using fewer, greater, or differently named modules located on the same audio player 103 or separate devices. Further, the audio injection application 120 may be configured to operate as background processes on the audio player 103 without user interaction; e.g., the audio injection application 120 may detect, equalize, select, inject, and supply ambient sounds and audio streams. Furthermore, in some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

Thus, FIG. 1 illustrates an example scenario where a user is attempting to listen to music while in a noisy environment, such as a passenger on an airliner/train or a cyclist in rush-hour traffic (e.g., environment 116), and thus employs noise cancellation headphones (e.g., headset 110). This is because noise cancelling headphones significantly increase a signal-to-noise ratio via ANC, which allows the user to reduce the ambient cabin or traffic audio (e.g., noise or ambient sound 116a) while clearly hearing their desired music (e.g., audio signals produced by speakers 113).

For instance, noise cancellation headphones achieve the increase signal-to-noise ratio by utilizing one or more microphones placed near the ear, and electronic circuitry that uses the microphone signal to generate the anti-noise signal. Further, when the anti-noise signal is produced by a speaker driver in the noise cancellation headphones, destructive interference cancels out the ambient noise as heard within the enclosed volume of the noise cancellation headphones. Thus, the noise cancellation by the noise cancellation headphones permits the listening to audio streams without raising the volume excessively. In addition to ANC, noise cancellation headphones may also depend on other methods, such as soundproofing, to prevent ambient sounds from reaching the ear.

Yet, with all the benefits of noise cancellation headphones, there may still be some ambient sounds that contain warnings, such as safety announcements or a car horn. Thus, the audio injection application 120 may enable a mixing or injection of insert signals based on the environment with the audio stream playing from the noise cancellation headphones.

While the headset 110 may be generally independent from the audio player 103, in other embodiments, the noise cancellation may instead be a network-based system. In such a system, the headset 110 includes a physical or wireless connection to the audio player 103 or a wireless connection to a wireless carrier (such as Verizon). The headset 110 may receive information for noise cancellation from a network-based server through this connection. This information may be based on the detection and conversion of ambient sounds (e.g., noise or ambient sound 116a) to digital audio samples by a microphone, which may be external or internal to the headset 110. The independent network-based computing system may store and provide to the headset 110 the various algorithms, heuristics, operational configurations, custom predetermined themes (e.g., profiles), and the like in support of audio injection by the headset 110. Moreover, this information may change from time to time based on geographic location and time. Thus, the computing system may periodically request audio samples from various headsets and other networked noise-canceling devices via the network in different geographic locations to build and keep current a database of noise cancellation information. The computing system may then update the audio injection application 120 and audio player 103 or external noise-canceling devices via the network. In turn, other devices on the network (e.g., the headset 110 and audio player 103) may periodically update the independent computing system with information about ambient sounds, heuristic use, and other data that may enhance audio injection. For example, the custom predetermined themes may be based on the interactions of devices other than the current device (e.g., the headset 110 and audio player 103), such as a first headset may employ the same heuristics utilized by a second headset based on a relative geographic location and time of the first and second headsets.

Figure 2:
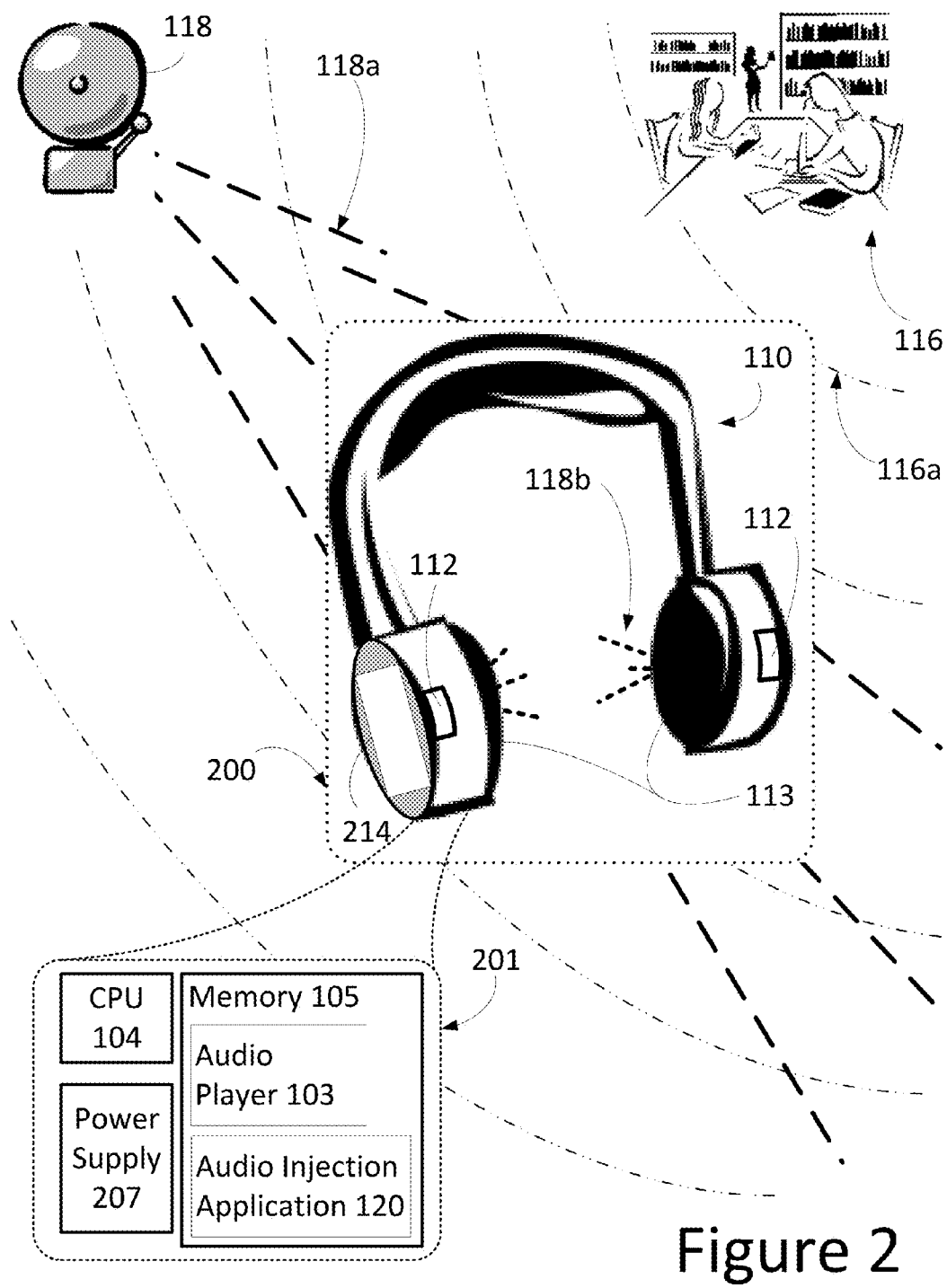
FIG. 2 illustrates an exemplary system in which ambient audio injection application operates.

FIG. 2 illustrates an exemplary system 200, including a headset 110 integrated the hardware components of a CPU 104, a memory 105, and a power supply 207.

The memory stores a software implementation of an audio player 103 and the audio injection application 120. Similar to FIG. 1, the audio injection application 120 equalizes the digital audio samples produced by microphones 112 and identifies discrete signals for injection into an audio stream processed by the (integrated) audio player 103 of the headset 110.

The power supply 207 is a device consisting of one or more electrochemical cells that convert stored chemical energy into electrical energy and is configured to supply electricity to the components of the exemplary system 200. Further, when a power supply is not included, as in the case of exemplary system 100 of FIG. 1, electricity may be supplied to the components of the exemplary system 100 via the connection between the headset 110 and the audio player 103 (e.g., wire 111).

In addition, the exemplary system 200 may include an electronic display 214, which may detect the presence and location of a touch such as a finger or a stylus, for displaying user interfaces 127a, as generated by the user interface module 127 of the audio injection application 120. Further, the electronic display 214 may receive user input that is reacting to the user interfaces 127a displayed by the electronic display 214.

Thus, as illustrated in FIG. 2, external to the exemplary system 200 is ambient sound 116a generated by a surrounding environment 116 that includes a discrete sound 118a generated by an object 118. Once the ambient sound 116a, including the discrete sound 118a, is detected by the audio injection application 120 via the microphones 112, the audio injection application 120 supplies an insert signal, which may be traced back to the discrete sound 118a, via the speakers 133 to produce a reproduced sound 118b.

In particular, in FIG. 2, an example scenario 200 is illustrated where noise cancellation headphones (e.g., headset 110) are employed to eliminate the noise (e.g., ambient sound 116a) generated by library activity (e.g., environment 116). The headset is integrated with an audio player 103 to implement an audio injection process (e.g., via the audio injection application 120) that identifies a bell sound (e.g., discrete sound 118a) generated by a fire bell (e.g., object 118), which is duplicated by the headphones (e.g., the speakers 113 of headset 110 output the reproduced sound 118b). Therefore, while the nature of the noise canceling headphones has eliminated or reduced the noise generated by the library activity, the audio injection process has detected, identified, and reproduced a bell sound in the library activity through the headphones to enhance the headphone wearer's situational awareness (e.g., provide a warning for a fire alarm).

Figure 3:
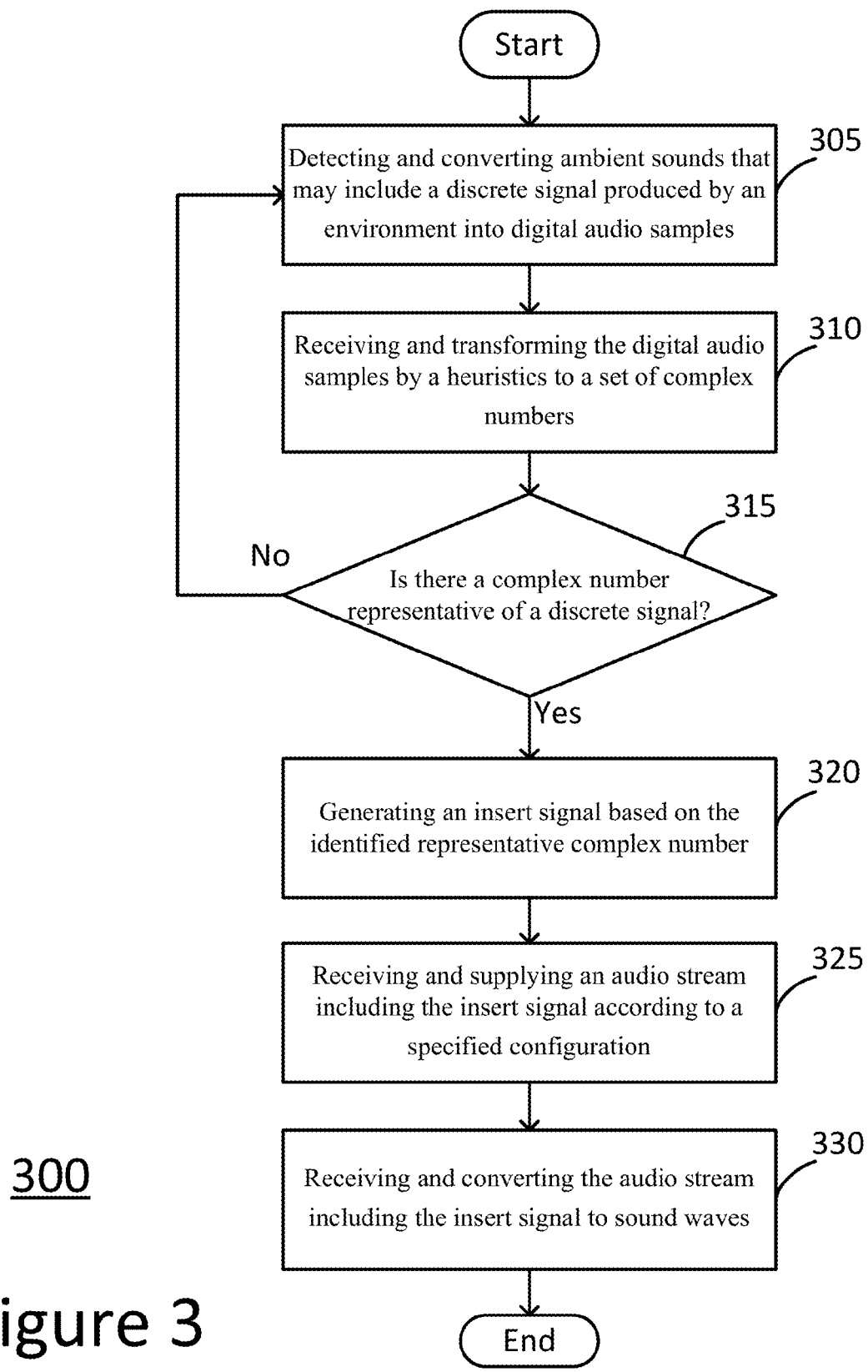
FIG. 3 illustrates an exemplary audio injection process for ambient audio injection.

FIG. 3 illustrates an exemplary audio injection process 300, as implemented an audio injection application 120, by for ambient audio injection that "Starts" by proceeding to block 305.

In block 305, a microphone 112 detects and converts the ambient sound 116a including the discrete sound 118a produced by the environment 116 into digital audio samples.

Next, in block 310, an equalizer module 121 of the audio injection application 120 receives the digital audio samples and utilizes appropriate heuristics to transform the digital audio samples into a set of complex numbers. For example, as illustrated in FIG. 1, the wire 111 connects the microphone 112 to the port 106 of the audio player 103, which in turn permits the equalizer module 121 to receive the digital audio samples.

Then, in decision block 315, a selector module 123 receives the set of complex numbers and utilizes a selection heuristic to identify the complex number representative of a discrete signal (e.g., relative to a discrete sound 118a) from the set of complex numbers. If the selection heuristic does not identify a complex number representative of a discrete signal, the selector module terminates the processing of the selection heuristic and the audio injection process 300 returns to block 305. If the selection heuristic identifies a complex number representative of a discrete signal, the audio injection process 300 proceeds to block 320 and the selector module 123 generates an insert signal, based on the identified complex number.

Next, in block 325, the audio module 125 receives from the selector module 123 and supplies to the headset 110 the insert signal based on a customized configuration or predetermined theme. For example, the audio module 125 generates an audio stream that comprises of at least the insert signal and supplies the audio stream via the port 106 to the headset 110.

Next, in step 330, the speakers 113 receive and convert the audio stream including the insert signal generated by the audio module 125 to sound waves and thus, the reproduced sound 118b is outputted by the speakers 113.

Next, the audio injection process 300 "Ends."

In view of the above, an example of configuring the audio injection application 120 will now be described below.

That is, when a user interface 127a generated by the interface module 127 for configuring the audio injection application displayed by the electronic display of the audio player 103, an input may be received to configure the equalizer heuristic, configure the selection heuristic, or customize the supplying the insert signal.

On example of configuring the selection heuristic through the user interface 127a includes building a frequency table that states the "if-then" logic. For instance, an input may be received to define which sounds of a set of sounds (e.g., recorded ambient sounds) may be converted by the equalizer module 121 to predetermined complex numbers. Then, an input may be received to associate a Boolean value to each predetermined complex number. Therefore, when the frequency table is applied in real time, the predetermined complex numbers will identify discrete signals according to the input that associated the Boolean value. Thus, the audio injection application 120 may be operate in a learning mode, in which the microphone 112 may record ambient sounds and the input received via the user interface 127a may define whether the recorded ambient sounds are discrete sounds.

On example of customizing the supply of the insert signal through the user interface 127a includes creating a predetermined theme, as described above. For instance, an input may define a name of a predetermined theme (e.g., cycling, flying, studying, etc.) that indicates the type of scenario in which the predetermined theme may be optimized. Further, once the name of the predetermined theme is inputted via the user interface 127a, customized configurations may be associated with that name, including setting definable mixing levels, configuring geographic and temporal settings, configuring alternatives to reproducing a detected discrete sound, setting duration thresholds, and selecting a frequency table, as defined above.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The invention claimed is:

1. A system, comprising:
 a microphone configured to convert individual ambient sounds including a discrete sound to individual digital audio samples including a discrete signal;
 a device including a memory with an audio injection application installed thereon, wherein the application comprises:
 an equalizer module that generates an anti-noise signal using the individual digital audio samples and analyzes a range of sound characteristics for each of the individual digital audio samples via a Fast Fourier Transform heuristic to transform a set of digital audio samples into complex numbers representing the range of sound characteristics;

a selector module that applies a selection heuristic to select the discrete signal from the individual digital audio samples based on the sound characteristics and a duration threshold, wherein the selection heuristic includes a Boolean selection heuristic configured to match in real time each complex number produced by the equalizer module to a set of predetermined complex numbers from a network-based server according to a geographic location of the device; and an audio module that supplies, to an output speaker, the anti-noise signal and an insert signal generated according to the discrete signal selected by the selection heuristic into a supplied audio stream at a pre-defined level based on an operation configuration to eliminate or reduce the ambient sounds and enhance situational awareness.

2. The system of claim 1, wherein the selection heuristic comprises a frequency band filter configured to select complex numbers relative to a frequency band lower than a set value.

3. The system of claim 1, wherein the audio module disables the insert signal in response to a predefined speed.

4. The system of claim 1, wherein the equalizer module detects sound characteristics of each individual digital audio sample that are representative of a pitch including a frequency, a timbre including a tone color, a loudness including an intensity, and a duration of individual ambient sounds, and transforms each digital audio sample into individual components representative of the respective sound characteristics.

5. The system of claim 1, wherein the operation configuration configured to define an insert signal supply method and volume levels at which the insert signal is supplied.

6. The system of claim 1, wherein the application further comprises an interface module configured to generate a user interface configured to receive a user input altering the operation configuration.

7. A method, comprising:
converting, by a microphone, individual ambient sounds including a discrete sound to individual digital audio samples including a discrete signal;
generating an anti-noise signal using the individual digital audio samples;
analyzing, by an electronic device, a range of sound characteristics for each of the individual digital audio samples via a Fast Fourier Transform heuristic to transform a set of digital audio samples into complex numbers representing the range of sound characteristics;
applying a selection heuristic to select the discrete signal from the individual digital audio samples based on the sound characteristics and a duration threshold, wherein the selection heuristic includes a Boolean selection heuristic configured to match in real time each complex number to a set of predetermined complex numbers from a network-based server according to a geographic location of the electronic device; and
supplying, to an output speaker of the electronic device, the anti-noise signal and an insert signal generated according to the discrete signal selected by the selection heuristic into a supplied audio stream at a pre-defined level based on an operation configuration to eliminate or reduce the ambient sounds and enhance situational awareness.

8. The method of claim 7, wherein the selection heuristic comprises a frequency band filter configured to select complex numbers relative to a frequency band lower than a set value.

9. The method of claim 7, further comprising detecting sound characteristics of each individual the digital audio sample that are representative of a pitch including a frequency, a timbre including a tone color, a loudness including an intensity, and a duration of individual ambient sounds, and transforming each digital audio sample into individual components representative of the respective sound characteristics.

10. The method of claim 7, wherein the operation configuration configured to define an insert signal supply method and volume levels at which the insert signal is supplied.

11. The method of claim 7, wherein the method further comprises: generating a user interface configured to receive a user input altering the operation configuration.

12. A non-transitory computer-readable medium tangibly embodying computer-executable instructions, comprising:
converting, by a microphone, individual ambient sounds including a discrete sound to individual digital audio samples including a discrete signal;
generating an anti-noise signal using the individual digital audio samples;
analyzing, by an electronic device, a range of sound characteristics for each of the individual digital audio samples via a Fast Fourier Transform heuristic to transform a set of digital audio samples into complex numbers representing the range of sound characteristics;
applying a selection heuristic to select the discrete signal from the individual digital audio samples based on the sound characteristics and a duration threshold, wherein the selection heuristic includes a Boolean selection heuristic configured to match in real time each complex number to a set of predetermined complex numbers from a network-based server according to a geographic location of the electronic device; and
supplying, to an output speaker of the electronic device, the anti-noise signal and an insert signal generated according to the discrete signal selected by the selection heuristic into a supplied audio stream at a pre-defined level based on an operation configuration to eliminate or reduce the ambient sounds and enhance situational awareness.

13. The medium of claim 12, wherein the selection heuristic comprises a frequency band filter configured to select complex numbers relative to a frequency band lower than a set value.

14. The medium of claim 12, further comprising detecting sound characteristics of each individual the digital audio sample that are representative of a pitch including a frequency, a timbre including a tone color, a loudness including an intensity, and a duration of individual ambient sounds, and transforming each digital audio sample into individual components representative of the respective sound characteristics.

15. The medium of claim 12, wherein supplying the insert signal is based on an operation configuration configured to define an insert signal supply method and volume levels at which the insert signal is supplied.

16. The medium of claim 12, wherein the instructions further comprise:
generating a user interface configured to receive a user input altering the operation configuration.

17. A device, comprising:
a microphone configured to convert individual ambient sounds including a discrete sound to individual digital audio samples including a discrete signal;

a memory with an audio injection application installed thereon, wherein the application comprises:

an equalizer module that generates an anti-noise signal using the individual audio samples and analyzes a range of sound characteristics for each of the individual digital audio samples via a Fast Fourier Transform heuristic to transform a set of digital audio samples into complex numbers representing the range of sound characteristics, a selector module that applies a selection heuristic to select the discrete signal from the individual digital audio samples based on the sound characteristics and a duration threshold, wherein the selection heuristic includes a Boolean selection heuristic configured to match in real time each complex number produced by the equalizer module to a set of predetermined complex numbers from a network-based server according to a geographic location of the device, and an audio module that supplies, to an output speaker, the anti-noise signal and an insert signal generated according to the discrete signal selected by the selection heuristic into a supplied audio stream at a pre-defined level based on an operation configuration to eliminate or reduce the ambient sounds and enhance situational awareness.

* * * * *